US010297724B2

(12) United States Patent
Morita et al.

(10) Patent No.: US 10,297,724 B2
(45) Date of Patent: May 21, 2019

(54) PACKAGE FOR MOUNTING LIGHT-EMITTING DEVICE

(71) Applicant: NGK SPARK PLUG CO., LTD., Nagoya, Aichi (JP)

(72) Inventors: Masahito Morita, Nagoya (JP); Kenji Suzuki, Ichinomiya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/029,766

(22) Filed: Jul. 9, 2018

(65) Prior Publication Data

US 2019/0013442 A1 Jan. 10, 2019

(30) Foreign Application Priority Data

Jul. 10, 2017 (JP) ................................. 2017-134259
Jun. 1, 2018 (JP) ................................. 2018-105829

(51) Int. Cl.
*H01L 33/48* (2010.01)
*H01L 33/64* (2010.01)
*H01L 33/62* (2010.01)

(52) U.S. Cl.
CPC ............ *H01L 33/483* (2013.01); *H01L 33/62* (2013.01); *H01L 33/642* (2013.01)

(58) Field of Classification Search
CPC ...... H01L 33/483; H01L 33/62; H01L 33/642
See application file for complete search history.

(56) References Cited

U.S. PATENT DOCUMENTS

| 5,247,134 A * | 9/1993 | Beltz | H01L 21/50 174/527 |
| 5,285,106 A * | 2/1994 | Deie | H01L 23/49827 174/549 |
| 5,403,784 A * | 4/1995 | Hashemi | H01L 21/4842 257/E23.042 |
| 5,434,358 A * | 7/1995 | Glahn | H01L 23/10 174/551 |
| 5,650,592 A * | 7/1997 | Cheskis | H01L 23/06 174/528 |

(Continued)

FOREIGN PATENT DOCUMENTS

| JP | H11-126840 A | 5/1999 |
| JP | 4058172 B2 | 3/2008 |
| JP | 2016-084528 A | 5/2016 |

*Primary Examiner* — Peter Bradford
(74) *Attorney, Agent, or Firm* — Stites & Harbison, PLLC; Jeffrey A. Haeberlin; James R. Hayne

(57) ABSTRACT

A light-emitting device mounting package includes a substrate, a frame extending upward from the substrate and surrounding a mounting portion, a lead plate supported on the frame, and a ceramic plate having a facing front surface and a facing back surface on the opposite side. The frame has a first through hole through which the lead terminal extends. The ceramic plate has a second through hole, and a metalized layer formed on the facing front surface such that the metalized layer is spaced from an opening of the second through hole. The lead plate penetrates the first and second through holes and is fixed, via a collar portion, to a region of the facing back surface around an opening of the second through hole on the facing back surface side. The insulating member is fixed to a region around the first through hole via the metalized layer.

9 Claims, 4 Drawing Sheets

(56) References Cited

U.S. PATENT DOCUMENTS

| | | | | |
|---|---|---|---|---|
| 6,111,199 A | * | 8/2000 | Wyland | ............... H01L 23/055 |
| | | | | 174/18 |
| 6,242,694 B1 | | 6/2001 | Muraki | |
| 6,440,778 B1 | * | 8/2002 | Okada | ............... H01L 27/14618 |
| | | | | 257/432 |
| 6,599,034 B2 | * | 7/2003 | Tatoh | ............... H01L 27/14618 |
| | | | | 385/94 |
| 2009/0242926 A1 | * | 10/2009 | Kimura | ............... H01L 23/055 |
| | | | | 257/99 |
| 2016/0120017 A1 | | 4/2016 | Momoi et al. | |
| 2017/0291397 A1 | | 10/2017 | Momoi et al. | |

\* cited by examiner

PACKAGE FOR MOUNTING LIGHT-EMITTING DEVICE

The present application claims priority to Japanese Patent Application No. 2017-134259, which was filed on Jul. 10, 2017, and Japanese Patent Application No. 2018-105829, which was filed on Jun. 1, 2018, the disclosure of which is herein incorporated by reference in its entirety.

BACKGROUND OF THE INVENTION

Field of the Invention

The present invention relates to a package for mounting a light-emitting device (hereinafter also referred to as a "light-emitting device mounting package") used for mounting a light-emitting device such as a laser diode.

Description of Related Art

A package for optical communication disclosed in, for example, Patent Document 1 includes a base plate formed of metal; a frame which is joined to a front surface of the base plate, is formed of metal, and has a quadrangular shape in plan view; a holder insertion portion (through hole) which is formed in one side wall of the frame and which is penetrated by a holder attached to one end of an optical fiber; a pair of ceramic substrates which are disposed in respective side walls located adjacent to the one side wall and facing each other and which individually penetrate the respective side walls; a plurality of conductor portions which are formed of tungsten or molybdenum, and extend between the inner and outer sides of the frame while penetrating the respective ceramic substrates; and a plurality of leads individually joined to the outer ends of the plurality of conductor portions.

In the above-described package for optical communication, a light-emitting device is later mounted on the surface of the base plate surrounded by the frame, and the terminals of the light-emitting device are individually connected, for electrical communication, to inner ends of the plurality of conductor portions by using bonding wires.

In the case of the package for optical communication, electrical power is supplied to a light-emitting device through the conductor portions. Since the electrical resistance of the conductor portions formed of tungsten or the like is high, the electrical power supplied to the light-emitting device cannot be increased sufficiently.

Furthermore, since the ceramic substrates having the conductor portions are inserted into quadrangular through holes formed in the side wails of the frame and are fixed thereto, if the differences between the inner dimensions of the through holes and the outer dimensions of the ceramic substrates are not strictly controlled to fall within respective dimensional tolerances, a problem arises. Specifically, insertion of the ceramic substrates into the through holes becomes difficult, or excessively large gaps are formed between the ceramic substrates and the wall surfaces of the through holes, which results in a failure to maintain the gastightness of the interior space of the package.

Related Art Document

Patent Document 1 is Japanese Patent Application Laid-Open (kokai) No. H11-126840 (pages 1 to 5 and FIGS. 1 to 5).

BRIEF SUMMARY OF THE INVENTION

An object of the present invention is to provide a light-emitting device mounting package which can solve the problems of the conventional techniques mentioned above; specifically, to provide a light-emitting device mounting package which can readily increase the amount of electric power supplied to a light-emitting device which is mounted inside the package at a later time and can reliably maintain the gastightness of the space inside the package.

In order to solve the above-described problems, the present invention has been accomplished on the basis of an idea of employing a structure in which a lead terminal extends through a through hole which penetrates one of a side wall of a frame and a substrate which constitute a package main body, and an insulating member which holds the lead terminal and electrically insulates it from the outside is joined to a region of the frame or the substrate around one opening of the through hole.

Namely, a package for mounting a light-emitting device of the present invention comprises: a substrate which has a mounting portion for a light-emitting device and has front and back surfaces; a frame which extends upward from the front surface; of the substrate and which has an inner wall surface surrounding the mounting portion and an outer wall surface; a lead terminal supported on the substrate or the frame; and an insulating member which has a facing front surface and a facing back surface, the facing front surface facing the front surface or the back surface of the substrate or the inner wall surface or the outer wall surface of the frame, and the facing back surface facing in a direction opposite a direction in which the facing front surface faces, wherein the substrate or the frame has a first through hole through which the lead terminal extends; the insulating member has a second through hole which extends between the facing front surface and the facing back surface, and a metalized layer is formed on the facing front surface to surround an opening of the second through hole on the facing front surface side; the lead terminal penetrates the first through hole and the second through hole and is fixed, via a collar portion radially extending from the lead terminal, to a region of the facing back surface around an opening of the second through hole on the facing back surface side; and the insulating member is fixed to a region of the substrate or the frame around the first through hole via the metalized layer. In other words, the package for mounting a light-emitting device includes a substrate, a frame, a lead terminal, a collar portion,, and an insulating member. The substrate includes a mounting portion for a light-emitting device and has a front surface and a back surface. The frame extends upward from the front surface of the substrate and has an inner wall surface surrounding the mounting portion and an outer wall surface. The lead terminal is supported by the substrate or the frame. The collar portion radially extends from the lead terminal. The insulating member has a facing front surface and a facing back surface, the facing front surface of the insulating member faces the front surface of the substrate, the back surface of the substrate, the inner wall surface of the frame, or the outer wall surface of the frame, and the facing back surface of the insulating member faces in a direction opposite a direction in which the facing front surface faces. The substrate or the frame defines a first through hole through which the lead terminal extends, the insulating member defines a second through hole extending between the facing front surface and the facing back surface, and a metalized layer is formed on the facing front surface of the insulating member to surround an opening of the second through hole at the facing front surface. The lead terminal penetrates the first through hole and the second through hole and is fixed, via the collar portion, to a region of the facing back surface of the insulating member around an opening of the second through hole at the facing back surface, and the insulating member is fixed to a region of the substrate or a region of the frame around the first through hole via the metalized layer.

The package for mounting light-emitting device achieves the following advantageous effects (1) and (2).

(1) Since the lead terminal successively penetrates the first through hole formed in the substrate or the frame and the second through hole formed in the insulating member, the lead terminal can be electrically connected, through a bonding wire or the like, to the light-emitting device, which is mounted later on the mounting portion on the front surface side of the substrate surrounded by the inner wall surface of the frame. Accordingly, it is possible to supply a sufficient amount of current corresponding to an increased amount of electric power which must be supplied to the light-emitting device.

(2) The lead terminal is fixed, via the collar portion extending in the radial direction thereof, to a region of the insulating member around the opening of the second through hole on the facing back surface side, and the insulating member is fixed to a region of the substrate or the frame around the first through hole via the metalized layer. Therefore, the lead terminal is supported on the frame or the substrate via two flat surfaces; i.e., the joining interface between the collar portion, and the facing back surface of the insulating member and the joining interface between the facing front surface of the insulating member and the outer wall surface of the frame or the front surface or back surface of the substrate. Accordingly, the gastightness of the space inside the package can be reliably maintained without performing strict dimensional tolerance control which has been performed conventionally.

Notably, the substrate and the frame may be separated from, each other and joined together (by means of brazing, welding, or the like). Alternatively, the substrate and the frame may be integrally formed as a single member which has a portion corresponding to the substrate and a portion corresponding to the frame. Such a member may be formed from a flat metal plate by means of plastic working such as press working or drawing.

The frame has the shape of a square tube or a cylindrical tube as a whole, and its opening is externally sealed by a metal cover plate or the like after a light-emitting device is mounted on the mounting portion at a later time.

Examples of the light-emitting device include a laser diode (LD) and a light-emitting diode (LED).

The lead terminal may be a plate-shaped lead plate or a rod-shaped lead pin, as will be described later.

The mounting portion for the light-emitting device may be an arbitrary region of the front surface of the substrate surrounded by the inner wall surface of the frame. Alternatively, the mounting portion may be the upper surface of a radiator which will be described later.

Each of the substrate, the frame, and the lead terminal are formed of, for example, Kovar (Fe-29%Ni-17%Co), so-called 42 alloy (Fe-42%Ni), or so-called 194 alloy (Cu-2.3%Fe-0.03%P).

A nickel film having a predetermined thickness and a gold film having a predetermined thickness are successively formed in this order on each of the surfaces of the substrate, the frame, and the lead terminal.

The first through hole is one of a plurality of first through holes which are formed in the substrate to extend between the front and back surface thereof or formed in each of opposite side wails of the frame. The first through holes extend straight in parallel to one another. Each of the first through holes may have a circular or quadrangular (square or rectangular) cross section.

The insulating member is constituted by a ceramic member, a resin member, or a glass member.

Namely, the present invention encompasses a package for mounting a light-emitting device in which the insulating member is a ceramic member.

In the case where the insulating member is a ceramic member, the ceramic member is formed of a high-temperature-fired ceramic such as alumina, aluminum nitride, or mullite, or a low-temperature-fired ceramic such as glass-ceramic.

A metallized layer similar to the above-described metallized layer is formed on the facing back surface of the ceramic member such that the metallized layer surrounds an opening of the second through hole and is spaced from the opening.

The second through hole is one of a plurality of second through holes which are formed in the ceramic member such that the plurality of second through holes extend straight in parallel to one another. Each of the second through holes has a circular or quadrangular form, and the opening of each second through hole is spaced from the metallized layer.

In the case where the insulating member is a resin member of a glass member, for example, polyimide-based or epoxy-based resin, borosilicate glass, quarts glass, or the like is used.

A metallized layer similar to the above-described metallized layer is formed on the facing back surface of the resin member or the glass member such that the metallized layer surrounds an opening of the second through hole and is spaced from the opening.

The second through hole is one of a plurality of second through holes which are formed in the resin member or the glass member such that the plurality of second through holes extend, straight in parallel to one another. Each of the second through holes has a circular or quadrangular cross section, and the opening of each second through hole is spaced from the metallized layer.

The present invention encompasses a package for mounting a light-emitting device in which the metallized layer is formed such that, the metallized layer is spaced from the opening of the second through hole on (at) the facing front surface side. In this case, the following advantageous effect (3) can be obtained.

(3) The metallized layer formed on the facing front surface of the insulating member is spaced from the opening of the second through hole which is open to the facing front surface. Therefore, when the insulating member is fixed to the region of the substrate or the frame around the first through hole, troubles such as formation of a short circuit are less likely to occur. Such troubles would otherwise occur when the brazing material layer disposed on and along the metallized layer comes into contact with the lead terminal.

The present invention -encompasses a package for mounting a light-emitting device in which the ceramic member is fixed to the substrate or the frame via the metallized layer and a brazing material layer disposed on and along the metallized layer. In this case, the above-described advantageous effects (2) and (3) can be obtained without fail.

Notably, in the case where the metallized layer is formed on the ceramic member, tungsten (hereinafter simply denoted as W), molybdenum (hereinafter simply denoted as Mo), or the like is used for the metallized layer.

In the case where the metallized layer is formed on the resin member of the glass member, copper (hereinafter simply denoted as Cu) is used for the metallized layer, An example of the material used to form the brazing material layer is silver brazing material (e.g., Ag—Cu alloy).

The present invention encompasses a package for mounting a light-emitting device in which the collar portion is a member separate from the lead terminal; the collar portion has a third through hole which has a quadrangular shape in plan view of the collar portion and has expanded portions at corners thereof which extend to the outside of the quadrangle; and the lead terminal penetrates the third through hole and is joined to a wall surface of the third through hole. In other words, the collar portion is a member separate from the lead terminal, the collar portion defines a third through hole having, in plan view, a quadrangular shape with expanded portions at corners thereof that extend outside of the quadrangle, and the lead terminal penetrates the third through hole and is joined to a wall surface of the third through hole.

In this case, the collar portion, which is a member separated from, the lead terminal, has a third through hole which has a quadrangular form which is similar to the outer shape of the cross section of the lead terminal and has expanded portions at corners thereof which extend to the outside of the quadrangle. When the lead terminal is caused to penetrate the third through hole, the expanded portions provided at the corners of the third through hole prevent occurrence of a situation where the lead terminal accidentally comes into contact with the collar portion and deforms. Also, it is possible to insert the lead terminal into the third through hole with the minimum gap formed therebetween, and it becomes easier to uniformly dispose a brazing material for joining the collar portion and the lead terminal over the entire wall surface of the third through hole. Accordingly, the above-described advantageous effect (2) can be obtained without fail.

Notably, the collar portion is formed of the same metal as that used for the lead terminal.

The present invention encompasses a package for mounting a light-emitting device in which the cellar portion is integrally formed on the lead terminal.

In this case, since the collar portion is integrally formed such that the collar portion bulges, along the radial direction, from the lead terminal at an arbitrary position in the axial direction, it becomes unnecessary to join the lead terminal and the collar portion at a later time. In addition, assembly of the lead terminal becomes easier, and the above-described advantageous effect (2) can be obtained more easily and more reliably.

The present invention encompasses a package for mounting a light-emitting device in which the mounting portion for the light-emitting device is separated from the substrate and is a portion of a radiator which is higher in thermal conductivity than the substrate; and the radiator is fixedly inserted into a fourth through hole which extends between the front surface and the back surface of the substrate. In other words, the mounting portion for the light-emitting device is separated from the substrate and is a portion of a radiator having a thermal conductivity higher than a thermal conductivity of the substrate, the substrate defines a fourth through hole extending between the front surface and the back surface, and the radiator is fixedly inserted into the fourth through hole of the substrate.

In the case, the radiator having the mounting portion for the light-emitting device is higher in thermal conductivity than the substrate and is fixedly inserted into the fourth through hole. Therefore, the heat generated by the light-emitting device, which is mounted on the mounting portion at a later time, can be effectively radiated to the outside of the package through the radiator (hereinafter, this effect will be referred to as the advantageous effect (4)).

Notably, the radiator is formed of, for example, copper, a copper alloy, an aluminum alloy, or the like.

The present invention encompasses a package for mounting a light-emitting device in which the fourth through hole has a rectangular shape, a square shape, or a circular shape in plan view; and the radiator has a rectangular parallelepiped shape, a cubic shape, or a circular columnar shape and has a flange which extends along a periphery of a bottom surface of the radiator and which can be joined to a region of the hack surface of the substrate around, an opening of the fourth through hole. In other words, in plan view, the fourth through hole has a rectangular shape, a square shape, or a circular shape, and the radiator has a rectangular parallelepiped shape, a cubic shape, or a circular columnar shape and includes a flange which extends along a periphery of a bottom surface of the radiator, the flange capable of being joined to a region of the back surface of the substrate around an opening of the fourth through hole.

In this case, the flange of the radiator, which is integrally formed along the periphery of the bottom surface of the main body hereof, is joined, via a brazing material or the like, to a region of the back surface of the substrate around the opening of the fourth through hole. Therefore, the above-described advantageous effects (2) and (4) can be achieved without fail.

The present invention encompasses a package for mounting a light-emitting device in which a difference in coefficient of linear expansion between the ceramic member and the substrate is 5 ppm ($K^{-1}$) or less, and a difference in coefficient of linear expansion between the ceramic member and the frame is 5 ppm ($K^{-1}$) or less.

In this case, since the difference in coefficient of linear expansion between the ceramic member and the substrate and the difference in coefficient of linear expansion between the ceramic member and the frame are relatively small; i.e., equal to or smaller than 5 ppm ($K^{-1}$), the thermal stress acting on the joining interface between the ceramic member and the substrate or the joining interface between the ceramic member and the frame is reduced. Therefore, the above-described advantageous effect (2) can be achieved more reliably.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Embodiments of the present invention will now be described.

Figure 1:
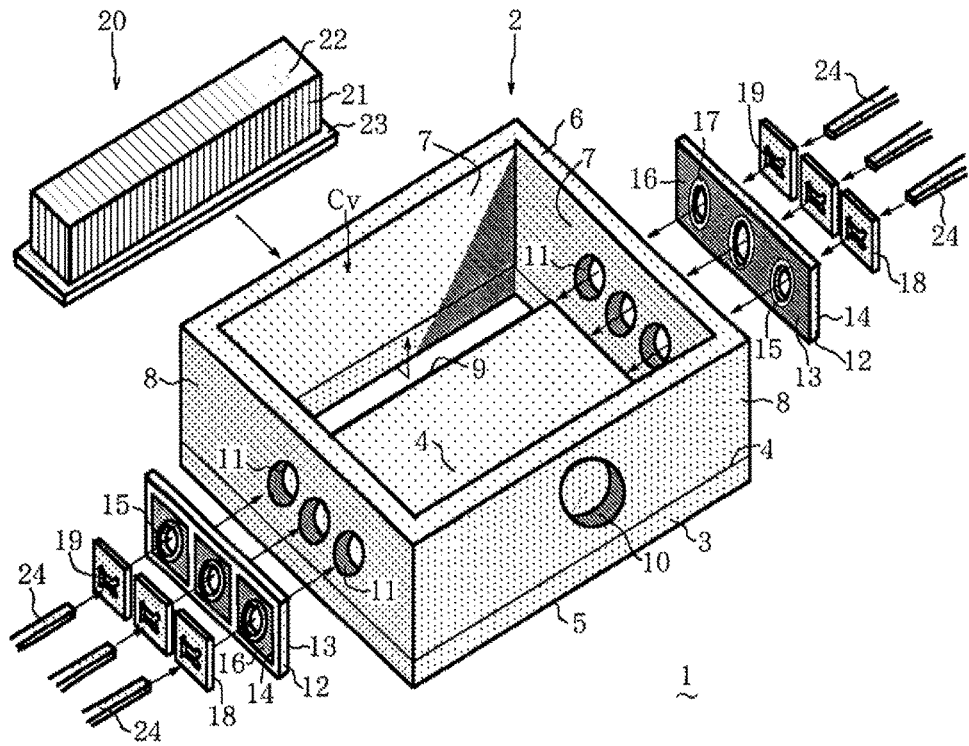
FIG. 1 is an exploded perspective view of a light-emitting device mounting package according to a first embodiment of the present invention.
Figure 2:
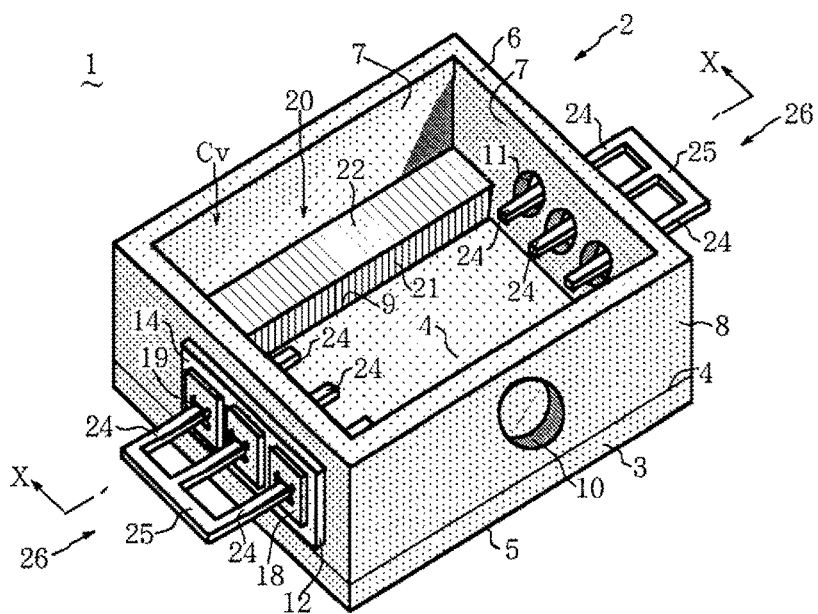
FIG. 2 is a perspective view of the light-emitting device mounting package according to the first embodiment of the present invention.

FIG. 1 is an exploded perspective view of a light-emitting device mounting package 1 according to a first embodiment of the present invention, and FIG. 2 is a perspective view of the light-emitting device mounting package 1.

As shown in FIGS. 1 and 2, the light-emitting device mounting package 1 includes a package main body 2 which has a box like shape as a whole; a pair of ceramic, plates (ceramic members/insulating members) 12 disposed on the left and right sides, respectively; a plurality of collar portions 18 individually joined to each of the ceramic plates 12; and a plurality of lead plates (lead terminals) 24 which, successively penetrate the collar portions 18 and the ceramic plates 12 and whose distal ends reach a cavity Cv inside the package main body 2.

The package main body 2 is composed of a flat substrate 3 which has a front surface 4 and a back surface 5 facing upward and downward, respectively; and a frame 6 which extends upward from the periphery of the front surface 4 of the substrate 3 and which has an inner wall surface 7 and an outer wall surface 8 each having a quadrangular (square or rectangular) in plan view. The front surface 4 of the substrate 3 surrounded by the inner wall surface 7 of the frame 6 has a mounting portion for an unillustrated light-emitting device. Alternatively, the mounting portion is a portion of a radiator which will be described later.

Notably, the substrate 3 and the frame 6 are formed of, for example, Kovar and are joined together by means of brazing, thereby forming the package main body 2. A nickel film and a gold film are successively formed on the entire surface of the package main body 2. The cavity Cv having a rectangular parallelepiped shape is surrounded by the front surface 4 of the substrate 3 and the inner wall surface 7 of the frame 6.

Each of a pair of side walls of the frame 6 which face each other has three first through holes 11 which extend between the inner wall surface 7 and the outer wall surface 8. The first through holes 11 are arranged in a horizontal row and are parallel to one another. A side wall of the frame 6 which is located between the pair of side walls and is located on the front side in FIGS. 1 and 2 has a through hole 10 which extends between the inner wall surface 7 and the outer wall surface 8. Light such as laser light is caused to pass through the through hole 10, or an optical fiber is inserted into the through hole 10.

On the rear side of the substrate 3 in FIGS. 1 and 2, a fourth through hole 9 having a rectangular shape in plan view is formed between the substrate 3 and the side walls of the frame 6. A main body 21 of a radiator 20 is inserted into the fourth through hole 9 from the back surface 5 side of the substrate 3 and is fixed to the substrate 3. The radiator 20 is formed of a 1, such as copper, which is higher in heat conductivity than the substrate 3. The radiator 20 is composed of a rectangular; parallelepiped main body 21 having an upper surface 22 including the light-emitting device mounting portion, and a flange 23 which protrudes from the main body 21 along the circumference of the bottom, surface of the main body 21. The flange 23 is joined to the back surface 5 of the substrate 3.

Figures 3A, 3B:
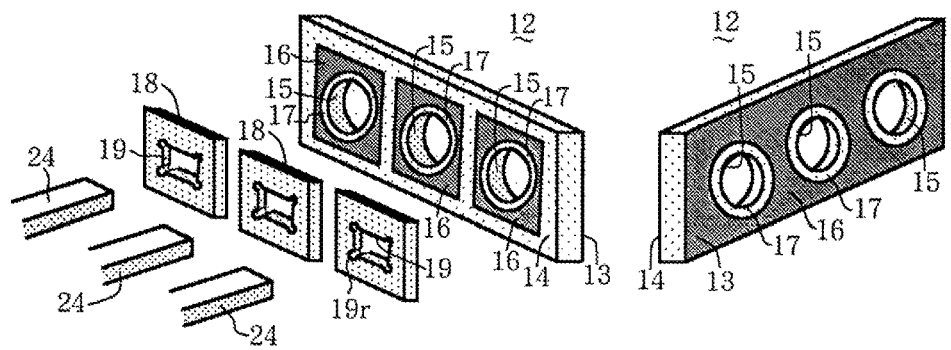
FIG. 3(A) is a perspective view showing a ceramic member, etc. used in the light-emitting device mounting package.
FIG. 3(B) is a perspective view of the ceramic member in a different angle of view.

As shown in FIG. 1 and FIGS. 3(A) and 3(B), the ceramic plates 12 are formed of, for example, alumina and have a rectangular shape which is long sideways. Each ceramic plate 12 has a facing front surface 13 which faces the outer wall surface 8 of the frame 6, and a facing back surface 14 which faces in a direction opposite a direction in which the facing front surface 13 faces. Each ceramic plate 12 has three second through holes 15 which extend between the facing front surface 13 and the facing back surface 14. The second though holes 15 are aligned horizontally and are parallel to one another. The facing front surface 13 has annular separation regions 1 which are provided around the openings of the second through holes 15 and in which the surface of alumina is exposed, and a metallized layer 16 which is formed of W or Mo and which covers the entirety of the facing front surface 13, excluding the separation regions 17. Namely, the metallized layer 16 exists between the second through holes 15 located adjacent to each other. Meanwhile, the facing back surface 14 has separation regions 17 which are similar to those of the facing front surface 13 and which are provided around the openings of the second through holes 15, and a plurality of rectangular metallized layers 16 which individually surround the respective separation regions 17.

Notably, the difference in coefficient of linear expansion between alumina used to form the ceramic plates 12 and Kovar used to form, the substrate 3 and the frame 6 is 5 ppm ($K^{-1}$) or less.

The collar portions 18 are formed of Kovar which is the same as the above-mentioned Kovar and, as shown in FIG. 3(A), have the shape of a flat plate as a whole. Each of the collar portions 18 has a third through hole 19 which extends between opposite surfaces thereof. The third through hole 19 has a quadrangular shape in side view and has expanded portions 19r at corners thereof which extend to the outside of the quadrangle and has an arcuate shape in side view. A nickel film and a gold film which are the same as the above-described nickel film and gold film are formed on the surface of the collar portion 18.

The lead plates 24 are also formed of Kovar which is the same as the above-mentioned Kovar. As shown on the left side of FIG. 2, the three lead plates 24 which are parallel to one another are included in a lead frame 26 having an E-like shape in plan view, together an end plate 25 which perpendicularly intersects and connects the proximal ends of the lead plates 24.

Figures 4A, 4B:
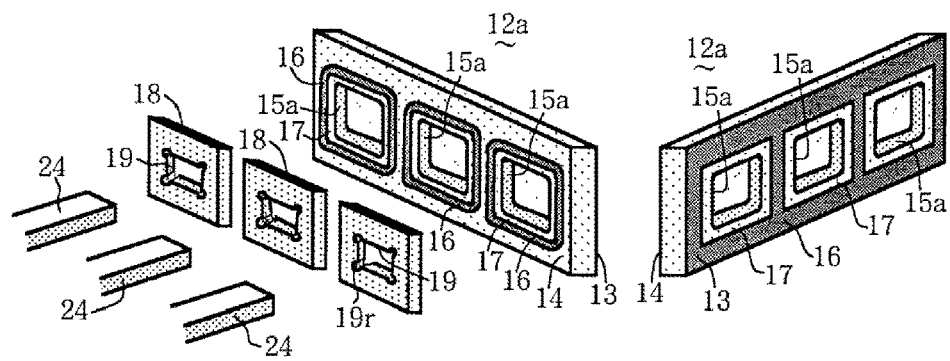
FIG. 4(A) is a perspective view showing a ceramic member, etc. of a second embodiment.
FIG. 4(B) is a perspective view of the ceramic member in a different angle of view.

Instead of the above-mentioned ceramic plate 12, a ceramic plate 12a shown in FIGS. 4(A) and 4(B) may be used. The ceramic plate 12a has three second through holes 15a which have a quadrangular shape in side view, extend between the facing front surface 13 and the facing back surface 14, and are arranged in a horizontal row. The facing front surface 13 has quadrangular separation regions 17 provided around the openings of the second through holes 15a, and a metallized layer 16 formed on the outer side of the separation regions 17. The facing back surface 14 has separation regions 17 which are the same as those of the facing front surface 13 and which are provided around the openings of the second through holes 15a, and a plurality of rectangular metallized layers 16 which individually surround the respective separation regions 17.

Figure 5:
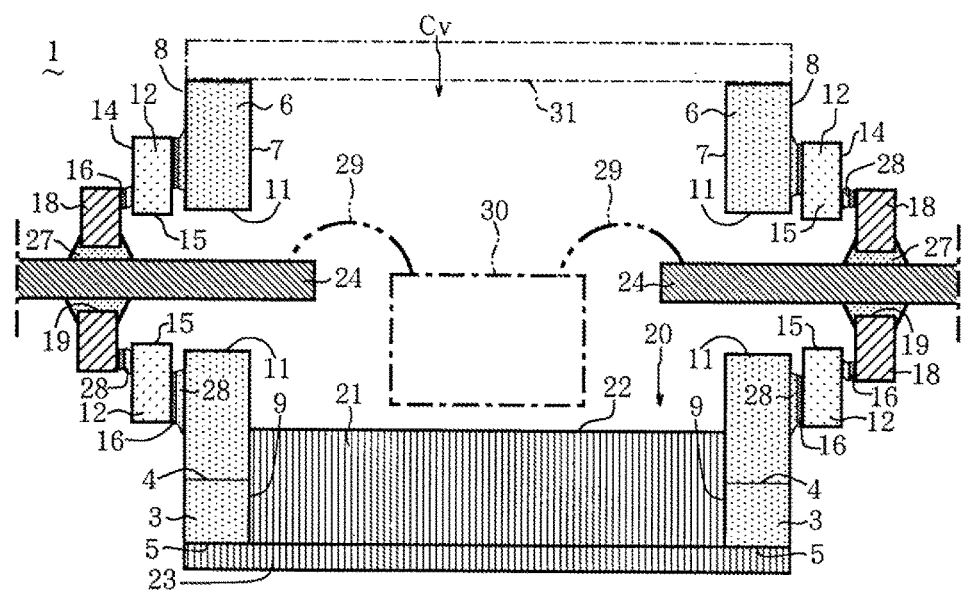
FIG. 5 is a vertical sectional view taken along line X-X in FIG. 2.

As shown in FIGS. 1 and 5, the pair of ceramic plates 12 are supported by the frame 6 as a result of their facing front surfaces 13 being joined to the opposite outer wall surfaces 8 of the frame 6, via bracing material layers 28 disposed on the metallized layers 16 formed on the facing front surface 13, such, that the second through holes 15 of the ceramic plates 12 become coaxial with the respective first through holes 11 of the frame 6.

As shown in FIG. 5, the plurality of lead plates 24 are individually inserted into the third through holes 19 of the collar portions 18 in advance, and a brazing material 27 is charged into the gaps between the wall surfaces of the third through holes 19 and the outer surfaces of the lead plates 24, whereby the collar portions 18 extending in the radial direction are joined to the respective lead plates 24. Notably, the brazing material 27 may be silver brazing material (Ag—Cu alloy). A nickel film and a gold film which are the same as the above-described nickel film and gold film are formed on the surfaces of the lead plates 24.

As indicated by oblique arrows in FIG. 1 and as shown in FIGS. 2 and 5, the collar portions 18 individually joined to the plurality of lead plates 24 are individually joined to the facing back surfaces 14 of the respective ceramic plates 12 via brazing material layers 28 and metallized layers 16 which are the same, as the above-described brazing material layers and metallized layers. The collar portions 18 located adjacent to each other are electrically insulated from each other.

As a result, as shown in FIGS. 2 and 5, the plurality of lead plates 24 are individually supported, via the respective collar portions 18 and the respective ceramic plates 12, on the outer wall surfaces 8 of a pair of side walls of the frame 6 facing each other. As a result, the lead plates 24 penetrate center portions of the second through holes 15 of the ceramic plate 12 and center portions of the first through holes 11 of the frame 6, and the distal ends or line lead plates 24 reach the cavity Cv of the package main body 2. As shown in FIG. 5, the distal ends of the lead plates 24 are electrically connected, via bonding wires 29, to a plurality of external electrodes (not shown) of a laser diode (light-emitting device) 30 which is mounted later on the mounting portion of the upper surface 22 of the radiator 20 which is inserted into the fourth through hole 9 and protrudes into the cavity Cv.

Subsequently, as shown in FIG. 5, a cover plate 31. formed of Kovar or the like is appropriately joined to the upper side of the frame 6 so as to seal the cavity Cv from the outside.

Notably, as shown in FIGS. 1 and 2, the lead plates 24 are electrically separated from one another as a result of the end plate 25 being cut from the lead frame 26.

As described above, in the light-emitting device mounting package 1, the lead plates 24 successively penetrate the center portions of the first through holes 11 of the frame 6 and the center portions of the second through holes 15, 15a of the ceramic plate 12, 12a. Therefore, the lead plates 24 can be electrically connected, through the bonding wires 29, to the light-emitting divide (30), which is mounted later on the mounting portion (22) located within the cavity Cv surrounded by the inner wall surface 7 of the frame 6. Accordingly, it is possible to supply a sufficient amount of current corresponding to an increased amount of electric power which must be supplied to the light-emitting divide (30).

The lead plates 24 are fixed, via the collar portions 18 extending in the radial direction thereof, to respective regions of the facing back, surfaces 14 of the ceramic plates 12, 12a around the openings of the second through holes 15, 15a, and the ceramic plates 12, 12a are fixed, via the metallized layers 16 and the bracing material, layers 28, to respective regions of the outer wall surface 8 of the frame 6 around the first through holes 11. Therefore, each of the lead plates 24 is supported on the frame 6 via two flat surfaces; i.e., the joining interface between the collar portion 18 and the facing back surface 14 of the ceramic plate 12, 12a and the joining interface between the facing front surface 13 of the ceramic plate 12, 12a and the outer wall surface 8 of the frame 6. Accordingly, the gastightness of the space inside the package main body 2 can be reliably maintained without performing strict dimensional tolerance control which has been performed conventionally.

The metallized layers 16 formed on the facing front surface 13 of each ceramic plate 12, 12a are spaced from the openings of the second through holes 15. Therefore, when the ceramic plates 12, 12a are fixed to the regions of the outer wall surface 8 of the frame 6 around the first through holes 11, troubles such as formation of a short circuit are less likely to occur. Such troubles would otherwise occur when the brazing material layers 28 disposed on and along the metallized layers 16 come into contact with the lead plates 24.

The radiator 20 is higher in heat conductivity than the substrate 3, and is inserted into the fourth through hole 9 and fixed to the substrate 3. Therefore, the heat generated by the laser diode 30, which is mounted on the mounting portion at a later time, can be effectively radiated to the outside through the radiator 20.

Since the difference in coefficient of linear expansion between the ceramic plates 12, 12a and the substrate 3 and that between the ceramic plates 12, 12a and the frame 6 are relatively small; i.e., equal to or smaller than 5 ppm ($K^{-1}$), the thermal stress acting on the joining interfaces between the ceramic plates 12, 12a and the frame 6 is reduced.

Accordingly, the light-emitting device mounting package 1 can achieve the above-described advantageous effects (1) through (4) without fail.

Figure 6:
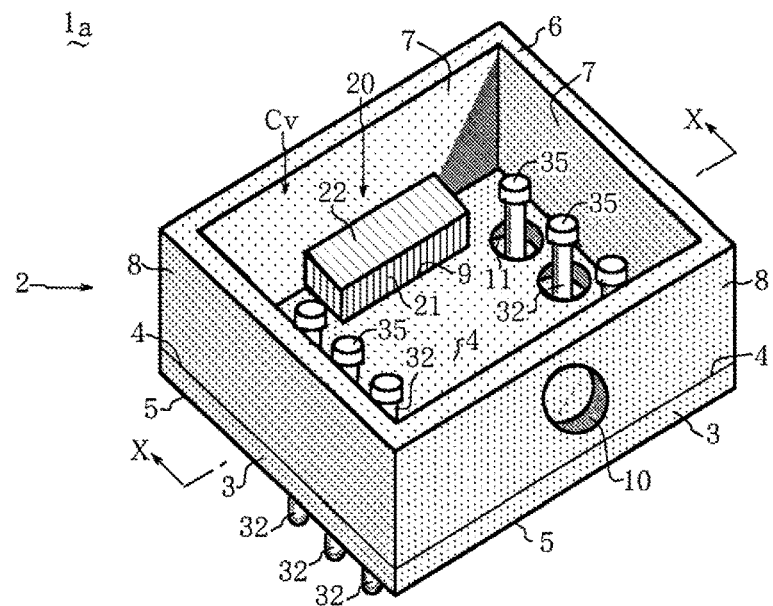
FIG. 6 is a perspective view of a light-emitting device mounting package according to a third embodiment of the present invention.
Figure 7:
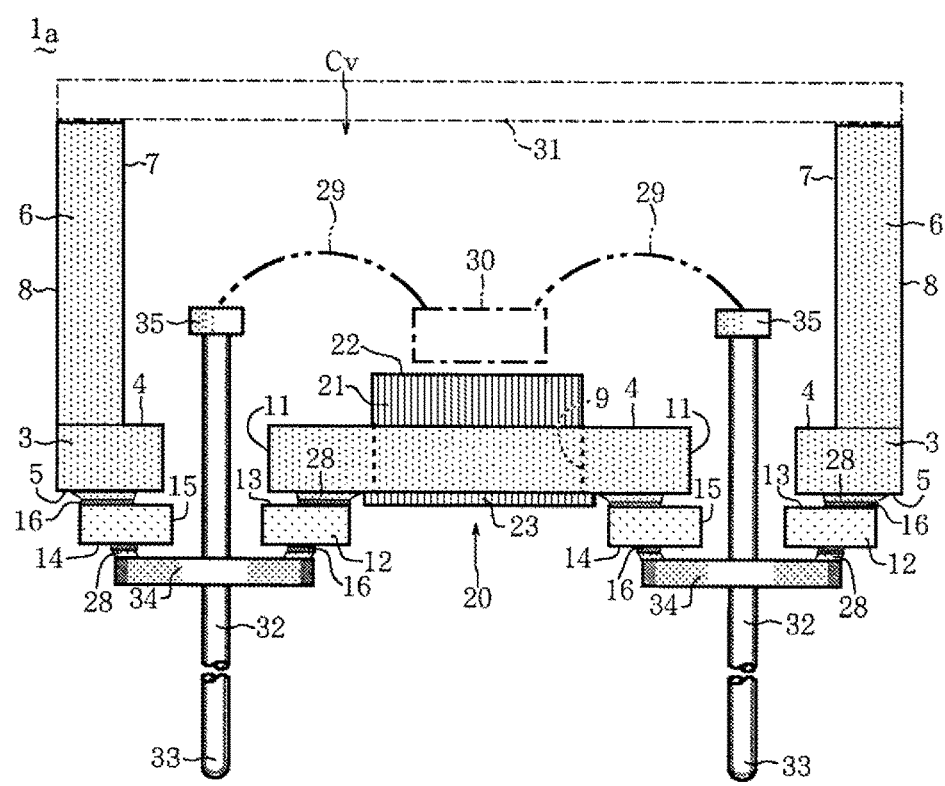
FIG. 7 is a vertical sectional view taken along line X-X in FIG. 6.

FIG. 6 is a perspective view of a light-emitting device mounting package 1a according to a third embodiment of the present invention, and FIG. 7 is a vertical sectional view taken along line X-X in FIG. 6.

As shown in FIGS. 6 and 7, the light-emitting device mounting package 1a includes a package main body 2 which is composed of a substrate 3 and a frame 6 which are similar to the substrate and the frame used in the first embodiment, and a pair of ceramic plates 12. In the light-emitting device mounting package 1a, the substrate 3 has three first through holes 11 arranged along each of a pair of sides of the substrate 3 which face each other. The substrate 3 has a fourth through holes 9 whose longer sides are shorter than those of the fourth through hole in the first embodiment.

As shown in FIG. 7, the pair of ceramic plates 12 which are similar to the ceramic plates in the first embodiment are joined to respective regions of the back surface 5 of the substrate 3 around the first through holes 11, via metallized layers 16 and brazing material layers 28 which are the same as the metallized layers and the brazing material layers in the first embodiment, such that the second through holes 15 become coaxial with the respective first through holes 11.

Notably, instead of the ceramic plate 12, the above-described ceramic plate 12a may be used.

A plurality of lead pins (lead terminals) 32 are supported such that the lead pins 32 individually penetrate central portions of the respective first through holes 11 of the substrate 3 and central portions of the respective second through holes 15 of the respective ceramic plates 12. The lead pins 32 are formed of Kovar which is the same as that used in the first embodiment. As shown in FIGS. 6 and 7, each lead pin 32 has a semispherical distal end portion 33 at the lower end, a head portion 35 at the upper end, and a disk-shaped collar portion 34 which radially extends from an axially intermediate portion of the lead pin 32. A nickel film and a gold film which are the same as the nickel and gold films in the first embodiment are successively formed on the surface of each lead pin 32.

Each of the lead pins 32 is supported by the back surface 5 side of the substrate 3 via the ceramic plats 12 as a result of a peripheral portion of the upper surface of the collar portion 34 being joined to a region of the facing back surface 14 of the ceramic plate 12 around the opening of the corresponding second through hole 15 via a brazing material layer 28 and a metallized layer 16 which are the same as the brazing material layer and the metallized layer in the first embodiment.

As shown in FIG. 7, the head portions 35 of the lead pins 32 are located in the cavity Cv surrounded by the front surface 4 of the substrate 3 and the inner wall surface 7 of the frame 6.

A radiator 20 which is similar to the radiator used in the first embodiment is inserted into the fourth through hole 9, and its flange 23 is joined to the back surface 5 of the substrate 3 via an unillustrated brazing material. A laser diode 30 is mounted later on the mounting portion of the upper surface 22 of the main body 21 of the radiator 20.

As shown in FIG. 7, a plurality of external electrodes (not shown) of the laser diode 30 are electrically connected to the head portions 35 of the respective lead pins 32 though bonding wires 29 which are the same as the bonding wires used in the first embodiment.

Notably, the distal end portions 33 of the lead pins 32 are used for electrical connection; specifically, the distal end portions 33 of the lead pins 32 are inserted into connection electrodes of an unillustrated motherboard such as a printed circuit board.

Figure 8:
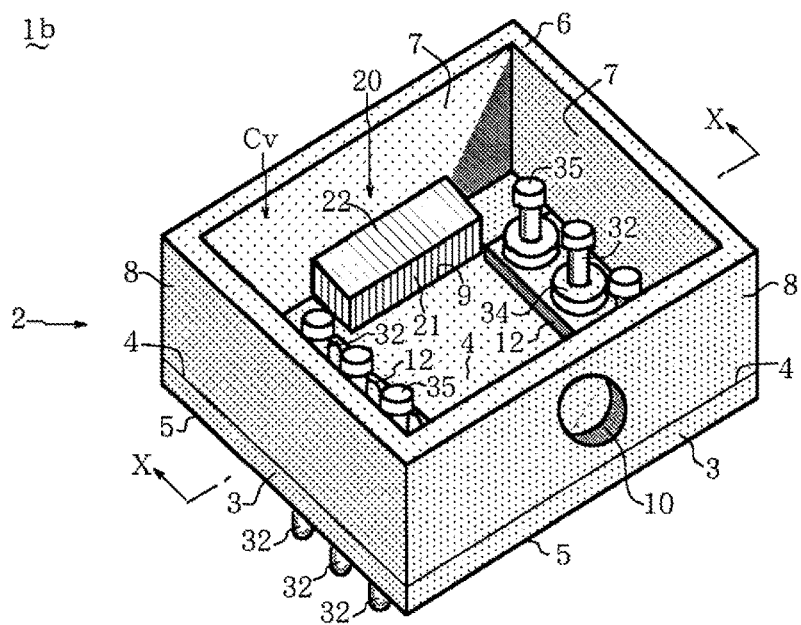
FIG. 8 is a perspective view showing a modification of the light-emitting device mounting package.
Figure 9:
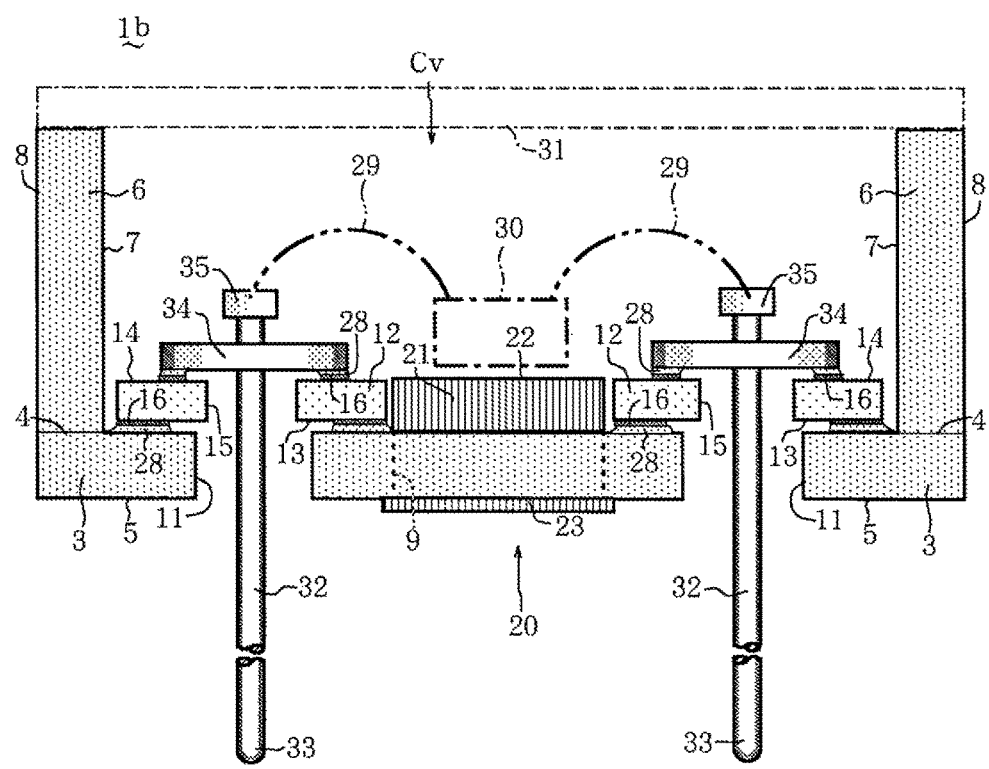
FIG. 9 is a vertical sectional view taken along line X-X in FIG. 8.

FIG. 8 is a perspective view of a light-emitting device mounting package 1b which is a modification of the light-emitting device mounting package 1a, and FIG. 9 is a vertical sectional view taken along line X-X in FIG. 8.

As shown in FIGS. 8 and 9, the light-emitting device mounting package 1b includes a package main body 2 which is composed of a substrate 3 and a frame 6 which are the same as the substrate and the frame used in the package 1a, and a pair of ceramic plates 12. In the light-emitting device mounting package 1b as well, the substrate 3 has three first through holes 11 arranged along each of a pair of sides of the substrate 3 which face each other. The substrate 3 has a fourth through hole 9 which is the same as the fourth through hole in the package 1a.

As shown in FIG. 9, the pair of ceramic plates 12 which are the same as the ceramic plates used in the package 1a are joined to respective regions of the front surface 4 of the substrate 3 around the first through holes 11, via metallized layers 16 and brazing material layers 28 which are the same as the metallized layers and the brazing material layers in the package 1a, such that the second through holes 15 become coaxial with the respective first through holes 11.

Notably, instead of the ceramic plate 12, the above-described ceramic plate 12a may be used.

A plurality of lead pins 32 are supported such that the lead pins 32 individually penetrate central portions of the first through holes 11 of the substrate 3 and central portions of the second through holes 15 of the ceramic plate 12. The lead pins 32 are formed of Kovar which is the same as that used in the package 1a. As shown in FIGS. 8 and 9, each lead pin 32 has a semispherical distal end portion 33 at the lower end, a head portion 35 at the upper end, and a disk-shaped collar portion 34 which radially extends from the lead pin 32 at a position immediately below the head portion 35.

Each of the lead pins 32 is supported by the front surface 4 side of the substrate 3 via the ceramic plate 12 as a result of a peripheral portion of the lower surface of the collar portion 34 being joined to a region of the facing back surface 14 of the ceramic plate 12 around the opening of the corresponding second through hole 15 via a brazing material layer 28 and a metallized layer 16 which are the same as the brazing material layer and the metallized layer in the package 1a.

As shown in FIG. 9, the head portions 35 of the lead pins 32 are located in the cavity Cv surrounded by the front surface 4 of the substrate 3 and the inner wall surface 7 of the frame 6.

A radiator 20 which is the same as the radiator used in the package 1a is inserted into the fourth through hole 9, and its flange 23 is joined to the back surface 5 of the substrate 3. A laser diode 30 is mounted later on the mounting portion of the upper surface 22 of the main body 21 of the radiator 20.

As shown in FIG. 9, a plurality of external electrodes (not shown) of the laser diode 30 are electrically connected to the head portions 35 of the respective lead pins 32 though bonding wires 29 which are the same as the bonding wires used in the package 1a.

As described above, in the above-described light-emitting device mounting packages 1a and 1b, the lead pins 32 successively penetrate the first through holes 11 of the substrate 3 and the second through holes 15 of the ceramic plates 12. Therefore, the lead pins 32 can be electrically connected, through the bonding wires 29, to the laser diode (light-emitting device) 30, which is mounted later on the mounting portion on the front surface 4 side of the substrate 3 or the mounting portion of the upper surface 22 of the radiator 20. Accordingly, it is possible to supply a sufficient amount of current corresponding to an increased amount of electric power which must be supplied to the laser diode 30.

The lead pins 32 are fixed, via their collar portions 34 extending in the radial direction thereof, to respective regions of the ceramic plates 12 around the openings of the second through holes 15 on the facing back surface 14 side, and the ceramic plates 12 are fixed, via the metallized layers 16 and the brazing material layers 28, to respective regions of the substrate 3 around the first through holes 11 of the substrate 3. Therefore, each of the lead pins 32 is supported by the substrate 3 via two flat surfaces; i.e., the joining interface between the collar portion 34 and the facing back surface 14 of the ceramic plate 12 and the joining interface between the facing front surface 13 of the ceramic plate 12 and the front surface 4 or back surface 5 of the substrate 3. Accordingly, the gastightness of the space inside the package main body 2 can be reliably maintained without performing strict dimensional tolerance control which has been performed conventionally.

The metallized layers 16 formed on the facing front surface 13 of each ceramic plate 12 are spaced from the openings of the second through hole 15. Therefore, when the ceramic plates 12 are fixed to the regions of the front surface 4 or back surface 5 of the substrate 3 around the first through holes 11, troubles such as formation of a short circuit are less likely to occur. Such troubles would otherwise occur when the brazing material layers 28 disposed on and along the metallized layers 16 accidentally come into contact with the lead pins 32.

The radiator 20 is higher in heat conductivity than the substrate 3 and is inserted into the fourth through hole 9 and fixed to the substrate 3. Therefore, the heat generated by the laser diode 30, which is mounted on the mounting portion (22) at a later time, can be effectively radiated to the outside through the radiator 20.

Since the difference in coefficient of linear expansion between the ceramic plates 12 and the substrate 3 and the frame 6 is relatively small; i.e., equal to or smaller than 5 ppm ($K^{-1}$), the thermal stress acting on the joining interfaces between the ceramic plates 12 and the substrate 3 is reduced.

Accordingly, the light-emitting device mounting package 1a and 1b can achieve the above-described advantageous effects (1) through (4) without fail.

In the case of the light-emitting device mounting package 1b, the ceramic plates 12 are disposed in the cavity Cv. Therefore, the overall height of the package 1b can be reduced in spite of its structure in which the ceramic plates 12 are surface-joined to the substrate 3 so as to secure gastightness.

In the light-emitting device mounting package 1a, recesses whose depth is equal to or greater than the thickness of the ceramic plates 12 may be formed in the back surface 5 of the substrate 3, and the ceramic plates 12 may be joined to the bottoms of the recesses so as to join the ceramic plates 12 to the substrate 3 by surface joining, thereby maintaining gastightness. In this case as well, the overall height of the package 1a can be reduced. In addition, since the ceramic plates 12 are surface-joined to the substrate 3, the recesses can be formed such that the width, of their openings is sufficiently larger than the width of the ceramic plates 12. Thus, it becomes unnecessary to strictly control the dimensional accuracy of the recesses.

In the light-emitting device mounting package 1, recesses whose depth is equal to or greater than the thickness of the ceramic plates 12 may be formed in the outer wall surface 8 of the frame 6, and the ceramic plates 12 may be joined to the bottoms of the recesses.

The present invention is not limited to the above-described embodiments.

For example, the substrate 3, the frame 6, the lead plates 24, the lead pins 32 may be formed of 42 alloy or 194 alloy.

The ceramic plates 12 and 12a may be formed of any one selected from aluminum nitride, mullite, and glass—ceramic, or may be formed of a resin plate (resign member) or a glass plate (glass member).

In place of the ceramic plates, resin plates or glass plates may be used. In the case where resin plates or glass plates are used, instead of the above-described bracing material layer 28, a soldering material, a resin-based adhesive, or a glass-based adhesive is used for bonding the plates to the frame 6 and the lead plate 24.

In the light-emitting device mounting package 1, the frame 6 may have first through holes which have a quadrangular cross section which is similar to the outer shape of the cross section of each lead plate 24.

The light-emitting device may be a light-emitting diode or the like.

A cylindrical holder for holding an optical fiber which has the same inner diameter as the through hole 10 may be provided on the outer wall surface 8 side of the through hole 10 of the frame 6.

The fourth through hole may have a circular shape, an elliptical shape, or a flat oval shape in plan view, and the main body of the radiator 20 may have a shape, in plan view, which is similar to the shape of the fourth through hole, for example, the circular shape.

The collar portion 34 of each lead pin 32 may have a quadrangular shape in plan view.

Any of alumina, silicic acid, boron oxide, zinc oxide, lead oxide, calcia, palladium, platinum, copper, gold, and carbon may be used for the brazing material (joining material) layer.

In the above-described embodiments, the ceramic member is the ceramic plate 12 having a plate-like shape. However, the ceramic member is not required to have a plate-like shape, so long as the ceramic member has at least a plate-shaped portion which can be surface-joined to the substrate 3 or the frame 6. For example, the ceramic member may be a ceramic member which has tabular portions vertically extending from the facing front surface 13 of the ceramic plate 12 and surround the openings on the facing front surfaces 13. In such a modified embodiment, the tubular portions are inserted into the first through holes 11 of the substrate 3 or the frame 6, and the plate-shaped portion of the ceramic member is surface-joined to the substrate 3 or the frame 6. Thus, the gas tightness of the space inside the present package can be secured. In addition, it is possible to prevent formation of a short circuit, which would otherwise be formed as a result of contact between the inner wall surface of a first through hole 11 and a lead terminal extending through the first through hole 11.

In the above-described embodiments, the difference in coefficient of linear expansion between the ceramic members and the substrate 3 or the frame 6 is 5 ppm ($K^{-1}$) or less. However, the difference in coefficient of linear expansion is not limited thereto, so long as gastightness is secured at the joining interface between each ceramic member and the substrate 3 or the frame 6. For example, in the case where the maximum length of the joining interface between each ceramic member and the substrate 3 or the frame 6 as measured along a straight line is 5 mm or less, joining which can secure gastightness is possible even when the difference in coefficient of linear expansion between the ceramic members and the substrate 3 is greater than 5 ppm ($K^{-1}$).

Each ceramic member may be surface-joined to the substrate 3 or the frame 6 in a state in which a member for reducing stress is interposed between the ceramic member and the substrate 3 or the frame 6. In this case, joining which can secure gastightness is possible even when the difference in coefficient of linear expansion is rendered greater than 5 ppm.

INDUSTRIAL APPLICABILITY

According to the present invention, there can be provided, without fail, a light-emitting device mounting package which can readily increase the amount of electric power supplied to a light-emitting device which is mounted inside the package at a later time and can reliably maintain the gastightness of the space inside the package

DESCRIPTION OF REFERENCE NUMERALS 1, 1a, 1b: light-emitting device mounting package
3: substrate 4: front surface
5: back surface
6: frame
7: inner wall surface
8: outer wall surface
9: fourth through hole
11: first through hole
12, 12a ceramic plate (ceramic member, insulating member)
13: facing front surface
14: facing back surface
15, 15a: second through hole
16: metallized layer
17: separation region
18, 34: collar portion
19: third through hole
19r: expanded portion
20: radiator
22: upper surface (mounting portion)
23: flange
24: lead plate (lead terminal)
32: lead pin (lead terminal)

What is claimed is:

1. A package for mounting a light-emitting device, comprising:
   a substrate including a mounting portion for a light-emitting device, the substrate having a front surface and a back surface;
   a frame extending upward from the front surface of the substrate, the frame having an inner wall surface surrounding the mounting portion and an outer wall surface;
   a lead terminal supported by the substrate or the frame;
   a collar portion radially extending from the lead terminal; and
   an insulating member having a facing front surface and a facing back surface, the facing front surface of the insulating member facing the front surface of the substrate, the back surface of the substrate, the inner wall surface of the frame, or the outer wall surface of the frame, and the facing back surface of the insulating member facing in a direction opposite a direction in which the facing front surface faces, wherein
   the substrate or the frame defines a first through hole through which the lead terminal extends;
   the insulating member defines a second through hole extending between the facing front surface and the facing back surface;
   a metallized layer is formed on the facing front surface of the insulating member to surround an opening of the second through hole at the facing front surface;
   the lead terminal penetrates the first through hole and the second through hole and is fixed, via the collar portion, to a region of the facing back surface of the insulating member around an opening of the second through hole at the facing back surface; and
   the insulating member is fixed to a region of the substrate or a region of the frame around the first through-hole via the metalized layer.

2. The package for mounting a light-emitting device according to claim 1, wherein the insulating member is a ceramic member.

3. The package for mounting a light-emitting device according to claim 1, wherein the metallized layer is spaced from the opening of the second through hole at the facing front surface.

4. The package for mounting a light-emitting device according to claim 2, wherein the ceramic member is fixed to the substrate or the frame via the metalized layer and a brazing material layer disposed on and along the metallized layer.

5. The package for mounting a light-emitting device according to claim 1, wherein
   the collar portion is a member separate from the lead terminal;
   the collar portion defines a third through hole having, in plan view, a quadrangular shape with expanded portions at corners thereof that extend, outside of the quadrangle; and
   the lead terminal penetrates the third through hole and is joined to a wall surface of the third through hole.

6. The package for mounting a light-emitting device according to claim 1, wherein the collar portion is integrally formed on the lead terminal.

7. The package for mounting a light-emitting device according to claim 1, wherein
   the mounting portion for the light-emitting device is separated from the substrate and is a portion of a radiator having a thermal conductivity higher than a thermal conductivity of the substrate;
   the substrate defines a fourth through hole extending between the front surface and the back surface; and
   the radiator is fixedly inserted into the fourth through hole of the substrate.

8. The package for mounting a light-emitting device according to claim 7, wherein
   the fourth through hole, in plan view, has a rectangular shape, a square shape, or a circular shape and
   the radiator has a rectangular parallelepiped shape, a cubic shape, or a circular columnar shape and includes a flange which extends along a periphery of a bottom surface of the radiator, the flange capable of being joined to a region of the back surface of the substrate around an opening of the fourth through hole.

9. The package for mounting a light-emitting device according to claim wherein
   a difference in coefficient of linear expansion between the substrate and the ceramic member is 5 ppm ($K^{-1}$) or less, and
   a difference in coefficient of linear expansion between the frame and the ceramic member is 5 ppm ($K^{-1}$) or less.

* * * * *